United States Patent

Park et al.

[11] Patent Number: 6,023,450
[45] Date of Patent: Feb. 8, 2000

[54] MULTIPLE BEAM OPTICAL PICKUP USING A VERTICAL CAVITY SURFACE EMITTING LASER ARRAY

[75] Inventors: Soo-han Park, Suwon; Jong-hwa Won, Yongin; Chun-seong Park, Suwon, all of Rep. of Korea

[73] Assignee: Samsung Electronics Co., Ltd., Kyungki-Co., Rep. of Korea

[21] Appl. No.: 08/960,059

[22] Filed: Oct. 29, 1997

[30] Foreign Application Priority Data

Oct. 29, 1996 [KR] Rep. of Korea ............ 96-49776

[51] Int. Cl.⁷ .................................................. G11B 7/00
[52] U.S. Cl. .................. 369/121; 369/44.23; 369/44.37; 369/94; 369/112; 369/118
[58] Field of Search .................. 369/118, 112, 369/121, 94, 44.23, 44.37, 58; 372/45, 96; 438/34

[56] References Cited

U.S. PATENT DOCUMENTS

| | | | |
|---|---|---|---|
| 4,988,153 | 1/1991 | Paek | 350/3.8 |
| 5,034,344 | 7/1991 | Jewell et al. | 438/34 |
| 5,034,958 | 7/1991 | Kwon et al. | 372/45 |
| 5,237,581 | 8/1993 | Asada et al. | 372/45 |
| 5,349,592 | 9/1994 | Ando | 372/32 |
| 5,351,256 | 9/1994 | Schneider et al. | 372/45 |
| 5,483,511 | 1/1996 | Jewell et al. | 369/44.37 |
| 5,638,353 | 6/1997 | Takahashi | 369/112 |
| 5,734,637 | 3/1998 | Ootaki et al. | 369/112 |
| 5,838,715 | 11/1998 | Corzine et al. | 372/96 |
| 5,844,879 | 12/1998 | Morita et al. | 369/118 |
| 5,926,450 | 7/1999 | Braat | 369/118 |

FOREIGN PATENT DOCUMENTS

| | | | |
|---|---|---|---|
| 0 537 904 | 4/1993 | European Pat. Off. | G11B 7/135 |
| 0 562 488 | 9/1993 | European Pat. Off. | G02B 27/00 |
| 0 731 457 | 9/1996 | European Pat. Off. | G11B 7/125 |
| 0 838 813 | 4/1998 | European Pat. Off. | G11B 7/125 |
| 195 08 256 | 7/1995 | Germany | G11B 7/12 |
| 5-120720 | 5/1993 | Japan . | |
| 6-20291 | 1/1994 | Japan . | |
| 6-124477 | 5/1994 | Japan . | |
| 6-259804 | 9/1994 | Japan . | |
| 7-302437 | 11/1995 | Japan . | |
| 7-326063 | 12/1995 | Japan . | |

OTHER PUBLICATIONS

Patent Abstracts of Japan vol. 015, No. 511 (P–1292), Dec. 25, 1991 & JP 03 222130 A (Ricoh Co., Ltd.) Oct. 1, 1991 *Abstract.

Patent Abstracts of Japan vol. 095, No. 001, Feb. 28, 1995 & JP 06 295467 A (Nippon Columbia Co Ltd) Oct. 21, 1994 *Abstract.

Patent Abstracts of Japan vol. 018, No. 587 (P–1824), Nov. 10, 1994 & JP 06 215406 A (Matsushita Electric Ind Co Ltd) Aug. 5, 1994, *Abstract.

*Primary Examiner*—Ali Neyzari
*Assistant Examiner*—Kim-Kwok Chu
*Attorney, Agent, or Firm*—Sughrue, Mion, Zinn, Macpeak & Seas, PLLC

[57] ABSTRACT

An optical pickup capable of multiple track scanning, including a light source having at least two vertical cavity surface emitting lasers (VCSELs) to emit at least two or more light beams and a light controlling device for controlling the focal position of a light formed on one type of recording medium of two formats of different thicknesses, is provided. The light emitted from each VCSEL is focused on adjacent tracks of the recording medium via a polarization beam splitter, the light controlling device and an objective lens in sequence, and the light reflected from the recording medium is received by a photodetector via the objective lens, the light controlling device and the polarization beam splitter. The number of photodetectors correspond to the number of VCSELs to receive lights corresponding to each track.

8 Claims, 6 Drawing Sheets

MULTIPLE BEAM OPTICAL PICKUP USING A VERTICAL CAVITY SURFACE EMITTING LASER ARRAY

BACKGROUND OF THE INVENTION

The present invention relates to an optical pickup capable of scanning multiple tracks simultaneously, and more particularly, to an optical pickup for recording and/or reproducing information simultaneously on/from a plurality of tracks of a recording medium, which can be one of two thicknesses.

FIG. 1 is a diagram showing the optical arrangement of a general optical pickup.

As shown in FIG. 1, the optical pickup includes a light source 10, an objective lens 25, a beam splitter 23 and a photodetector 29. The optical source 10 includes a general edge emitting laser which emits light from the side of stacked semiconductor material layers. Referring to FIG. 2A, the edge emitting laser diode is attached to a side wall of a mount 12 fixed on a base 13 such that the light emitted from the side heads toward a recording medium 1 (see FIG. 1). As an alternative, as shown in FIG. 2B, the edge emitting laser diode 11 may be installed on a base 15, and a reflection mirror 14 for reflecting the light toward the beam splitter 23 (see FIG. 1) may be used.

The objective lens 25 of FIG. 1 converges the light from the light source 10 to focus a light spot on a recording surface of the recording medium 1.

The beam splitter 23 which is positioned on an optical path between the light source 10 and the objective lens 25 reflects most of the light from the light source 10 and transmits the light reflected from a recording surface of the recording medium 1 toward the photodetector 29.

The photodetector 29 receives the light reflected from the recording surface of the recording medium 1 to detect a radio frequency (RF) signal and an error signal. The photodetector 29 includes a plurality of divided plates (not shown) each receiving light independently.

Also, the optical pickup includes a grating 21 and a collimating lens (not shown) which are positioned between the light source 10 and the recording medium 1. The grating 21 diffracts the incident light into a 0-order beam and ±1st-order beams such that the photodetector 29 can detect a tracking error signal by a three-beam method. The collimating lens collimates a divergent beam.

Also, an astigmatism lens 27 may be further included on an optical path between the beam splitter 23 and the photodetector 29. Generally, the astigmatism lens 27 is semi-cylindrical in shape, and forms a circular beam on the photodetector 29 when the distance between the objective lens 25 and the recording medium 1 is in focus, and an oval beam on the photodetector 29 in other cases.

In the optical pickup having the above structure, information is recorded or reproduced while a single light beam emitted from the light source 10 travels spirally along tracks formed on the recording surface of the recording medium 1. Thus, the information processing speed of a recording/reproducing apparatus adopting the above optical pickup depends on the rotation speed of a spindle motor 5 rotating the recording medium 1. Thus, there is a limitation to increasing the rotation speed of the motor, and the stability of the system is lowered.

SUMMARY OF THE INVENTION

It is an object of the present invention to provide an optical pickup capable of simultaneously scanning a plurality of tracks of a recording medium to improve the information processing speed without increasing the rotation speed of a spindle motor, and capable of compatibly adopting recording media of different formats.

To achieve the first object, there is provided an optical pickup comprising: a light source including at least two vertical cavity surface emitting lasers (VCSELs) arranged adjacent to each other to emit light parallel to the stacking direction of semiconductor material layers of the VCSEL; an objective lens which converges at least two lights emitted from the light source on a recording medium; a polarization beam splitter positioned on a light path between the light source and the objective lens, which changes the traveling direction of an incident light; a light controller positioned on the light path between the light source and the recording medium, for controlling a focal position of the light converged by the objective lens; and at least two photodetectors each receiving light reflected from the recording medium via the objective lens and the polarization beam splitter.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
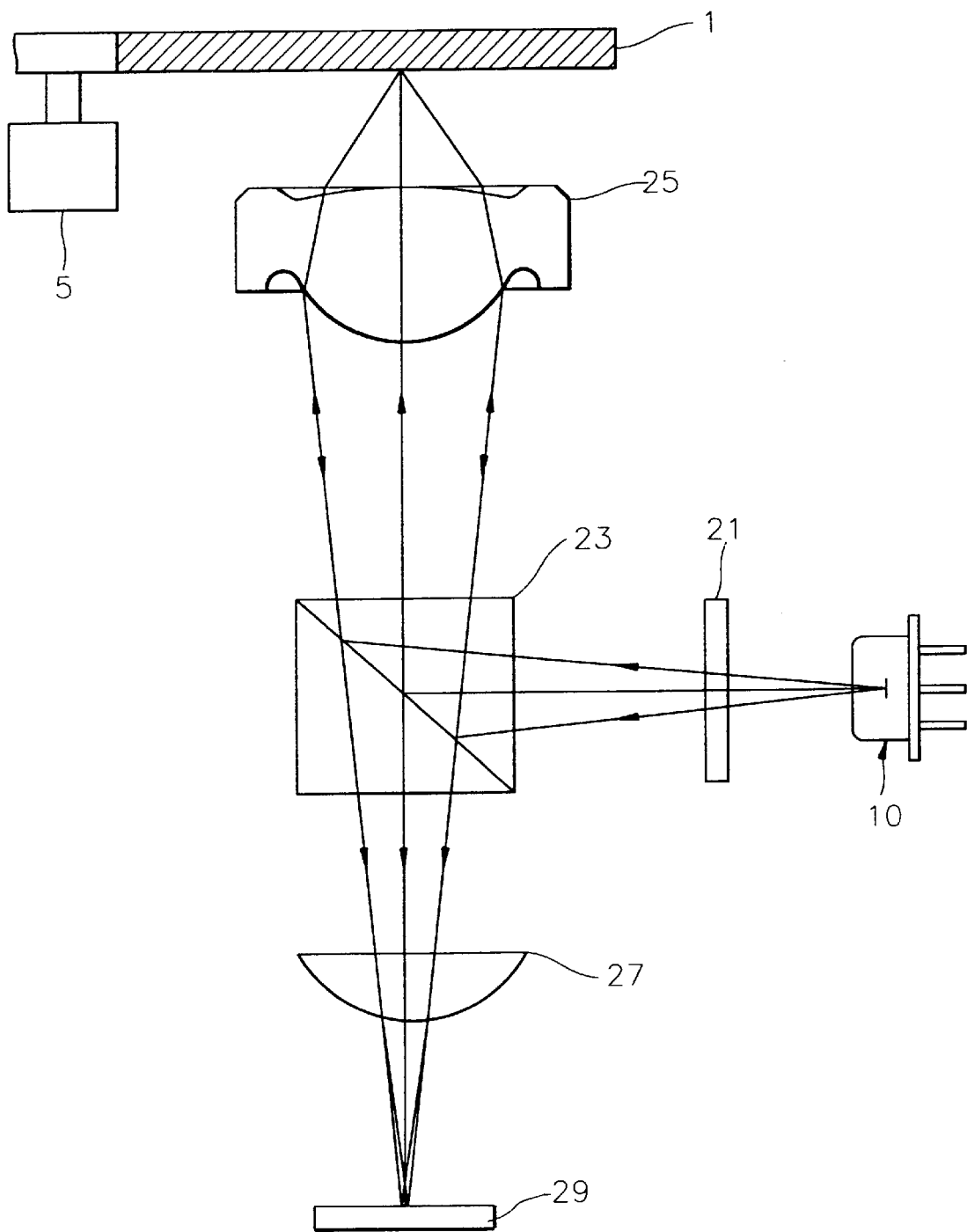
FIG. 1 is a diagram showing the optical arrangement of a conventional optical pickup.
Figure 2A:
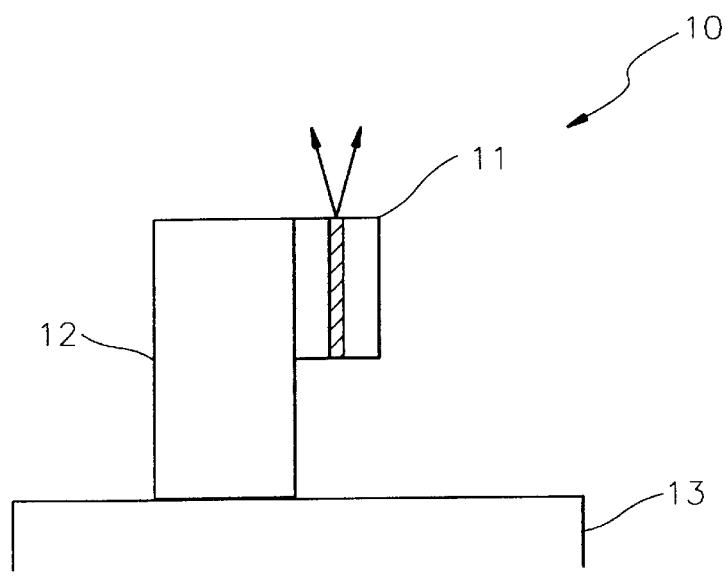
FIGS. 2A and 2B are diagrams showing examples of a light source adopted in the conventional optical pickup.
Figure 2B:
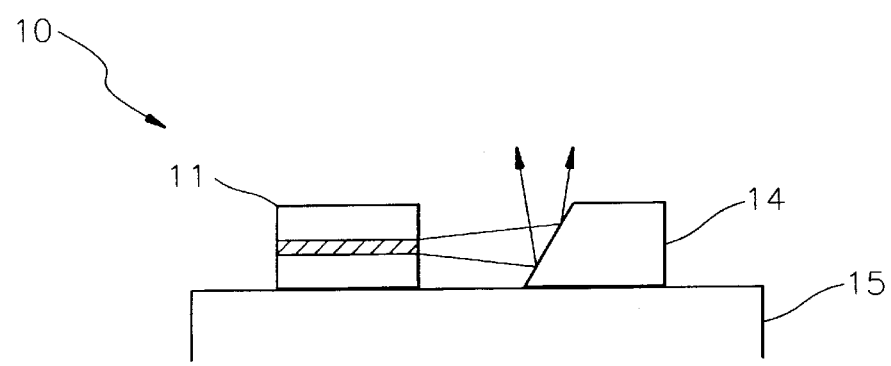
Figure 3:
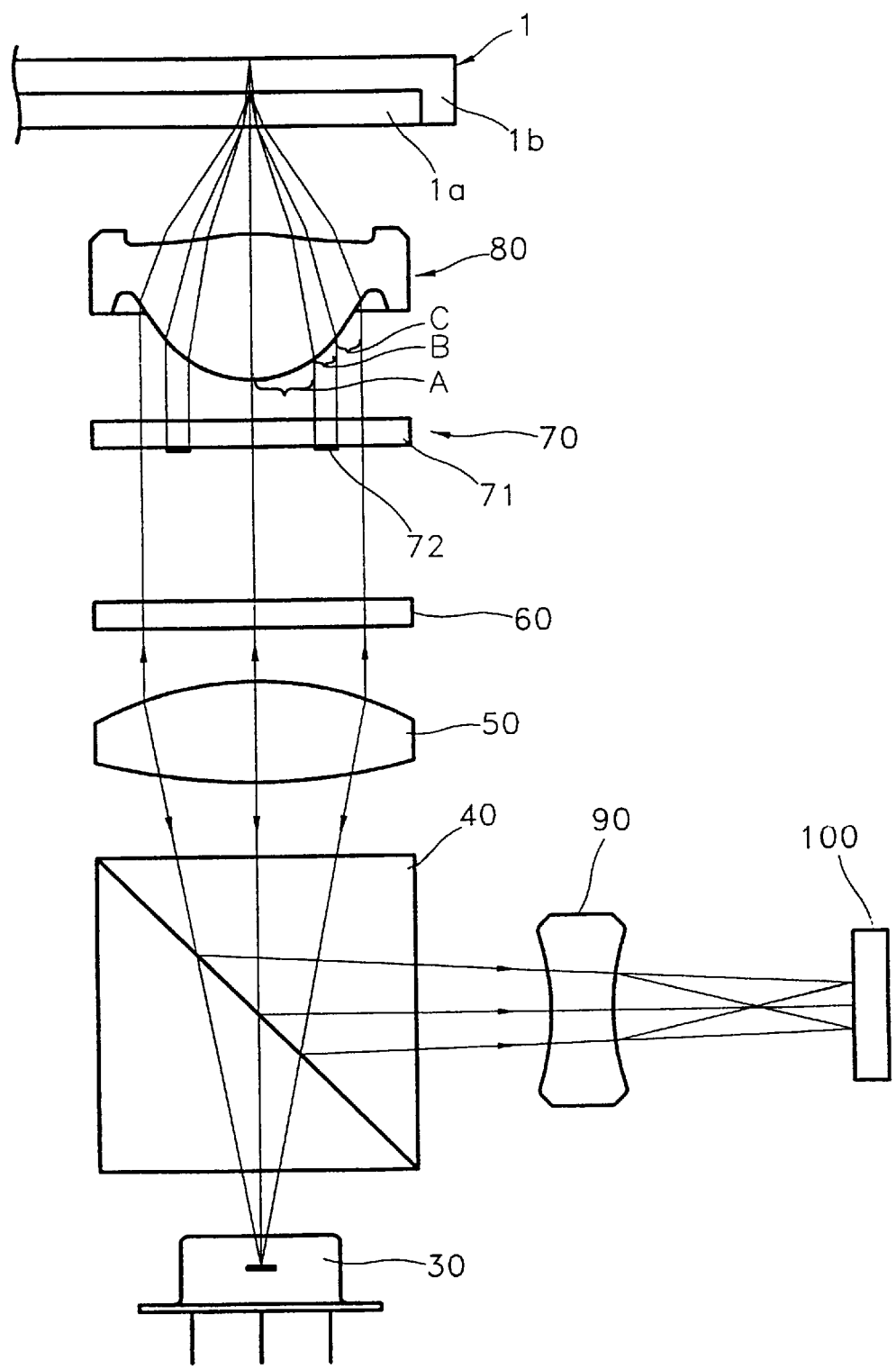
FIG. 3 is a diagram showing the optical arrangement of an optical pickup capable of multiple-track scanning according to a preferred embodiment of the present invention.

Referring to FIG. 3, an optical pickup according to a preferred embodiment of the present invention includes a light source 30 for emitting a laser beam, an optical path changing means such as a polarization beam splitter 40 for changing a traveling path of an incident light, an objective lens 80 for converging the incident light on the recording surface of a recording medium 1, a light controller 70 for controlling a focal position of the light converged by the objective lens 80, and a photodetector 100 for receiving the light reflected from the recording medium 1 via the polarization beam splitter 40.

The light source 30 is a semiconductor laser for emitting two or more laser beams to form optical spots on at least two spiraling tracks 1a, 1b formed on the recording surface of the recording medium 1. Preferably, the light source 30 includes at least two vertical cavity surface emitting lasers (VCSELs) which are adjacent to each other and emit light parallel to the stacked direction.

Figure 4:
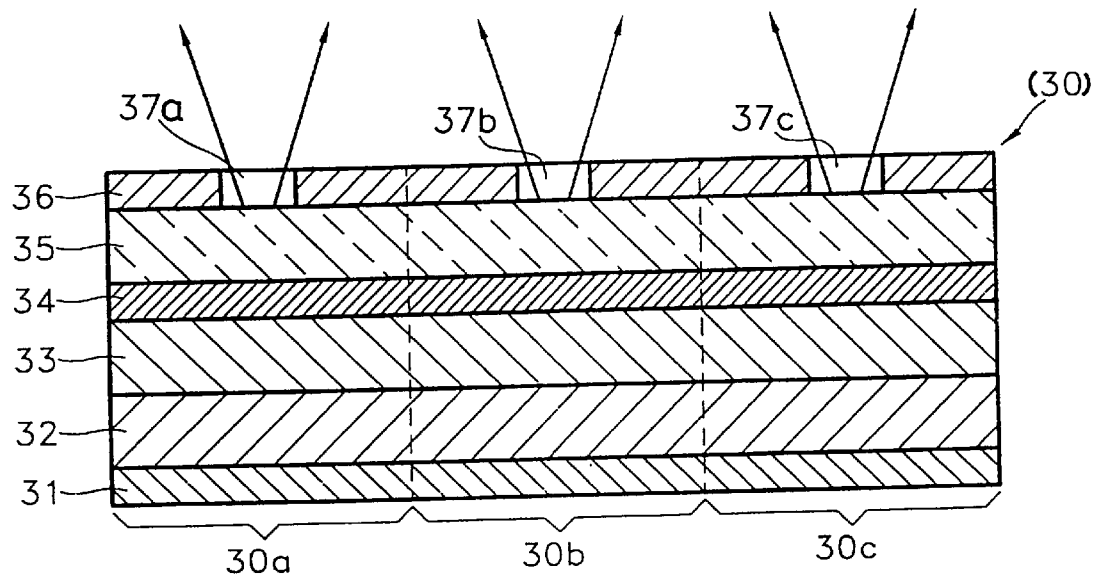
FIG. 4 is a sectional view schematically showing a vertical cavity surface emitting laser (VCSEL) adopted in the optical pickup according to the present invention.

FIG. 4 shows an example of the light source 30 including first, second and third VCSELs 30a, 30b and 30c which are adjacent to each other. The VCSELs 30a, 30b and 30c each include a substrate 32, and a lower distributed Bragg reflecting (DBR) layer 33, an active layer 34 and an upper DBR layer 35 which are sequentially stacked on the substrate 32, and a lower electrode layer 31 formed below the substrate 32, and an upper electrode layer 36 formed on the upper DBR layer 35.

The lower DBR layer 33 is formed by alternately stacking two same-type semiconductor material layers each having different reflectivities. The upper DBR layer 35 is formed by alternately stacking two semiconductor material layers different from the lower DBR layer 33 and having different reflectivities from each other.

Windows 37a, 37b and 37c are formed in the upper electrode layer 36 to emit light passed through the upper DBR layer 35. Generally, the first, second and third VCSELs 30a, 30b and 30c are manufactured on one substrate 31 by the same process.

When the first, second and third VCSELs 30a, 30b and 30c are adopted as the light source 30, the lights emitted from the three windows 37a, 37b and 37c are focused on different tracks of the recording surface of the recording medium 1 after passing the polarization beam splitter 40 (see FIG. 3) and the objective lens 80. Here, preferably, the objective lens 80 is an aspherical lens for converging the light being incident from different paths on different tracks of the recording medium.

As an alternative, the light source 30 may be implemented by edge emitting lasers in an array structure.

The polarization beam splitter 40 directly transmits the light having one polarization direction being incident from the light source 30, and reflects the light having different polarization direction being incident from the objective lens 80. Here, it is preferable to further include a λ/4 retardation plate 60 for changing an incident linear polarized light into a circular polarized light and an incident circular polarized light into a linear polarized light on the optical path between the polarization beam splitter 40 and the objective lens 80.

In the present invention, the optical path changing means is not limited to the polarization beam splitter 40, and may further include a beam splitter for transmitting and reflecting the incident light with a predetermined light amount ratio and a holographic optical element (HOE) for linearly transmitting or diffractively transmitting the incident light according to the incident direction.

The light controller 70 controls the size of the light spot focused on the recording medium 1 via the objective lens 80, such that a plurality of disk formats having different thicknesses, such as a 12 mm CD 1b or a 6 mm DVD 1a, can be compatibly adopted as the recording medium 1.

For the above, as shown in FIG. 3, the light controller 70 may include a transparent member 71 having a light blocking portion 72 for blocking at least part of the light passed through an intermediate domain B of the objective lens 80, which is arranged on the optical path being separated from the objective lens 80. This is based on the fact that the focal positions of lights passed through a near axis domain A of the objective lens 80 and a far axis domain C are different due to the spherical aberration of the objective lens 80. Here, "near axis domain A" represents a domain having a negligible spherical aberration and which is near the central axis (optical axis) of the objective lens 80. "Far axis domain C" represents a domain which is relatively far from the optical axis compared with the near axis domain A and has a spherical aberration relatively greater than that of the near axis domain A, and "intermediate domain B" represents a domain between the near axis domain A and the far axis domain C.

Preferably, the light blocking portion 72 is formed by performing a reflective coating on the transparent member 71 or forming a scattering pattern thereon.

Figure 5:
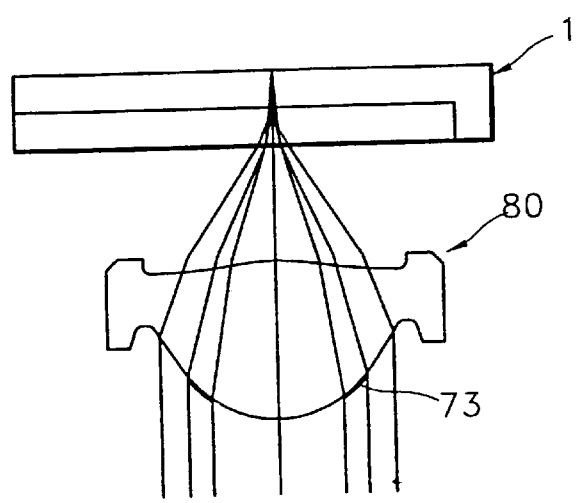
FIG. 5 is a diagram schematically showing an example of a light controller adopted in the optical pickup according to the present invention.
Figure 6:
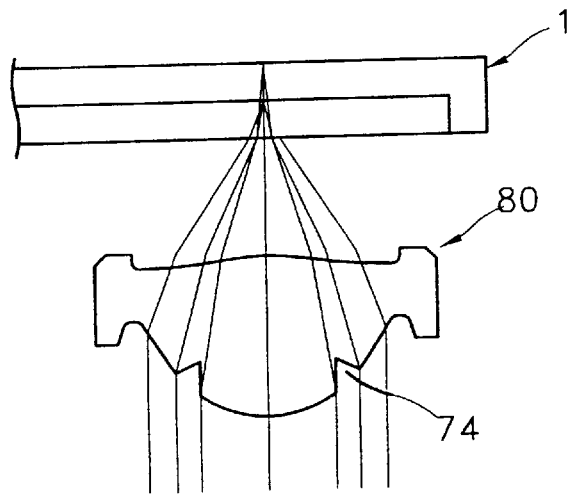
FIG. 6 is a diagram schematically showing another example of the light controller adopted in the optical pickup according to the present invention.

Also, the light controller may include a light controlling portion formed directly on the surface of the objective lens 80. That is, as shown in FIG. 5, the light controller may include a light controlling layer 73 coated on the surface of the objective lens, for blocking or scattering at least part of the light incident onto the intermediate domain of the objective lens 80. Also, as shown in FIG. 6, the light controller may include an annular groove 74 formed on the surface of the objective lens 80 to scatter or reflect the incident light.

Figure 7:
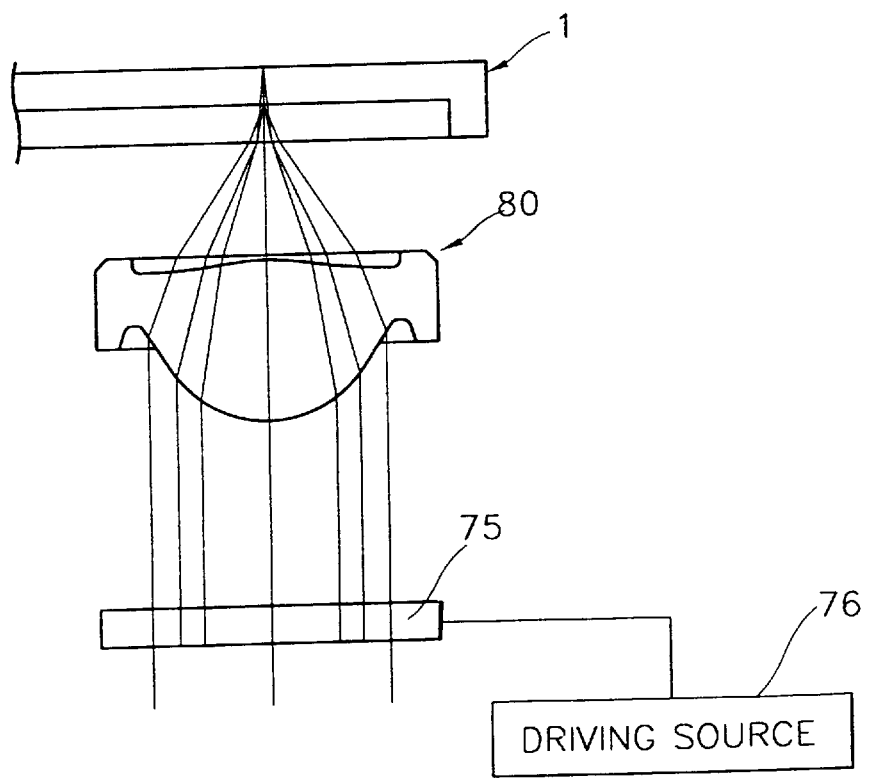
FIG. 7 is a diagram schematically showing still another example of the light controller adopted in the optical pickup according to the present invention.

Still another example of the light controller is shown in FIG. 7. Referring to FIG. 7, the light controller includes a liquid crystal panel 75 arranged on the optical path being separated from the objective lens 80 and a driving source 76 for selectively applying power to the liquid crystal panel 75. The liquid crystal panel 75 selectively transmits the light by each pixel according to the type of recording medium to control the position of the incident light on the objective lens.

Figure 8:
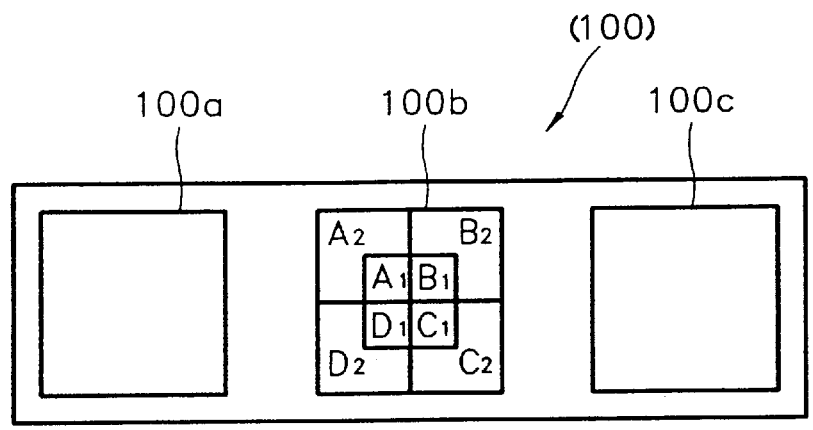
FIG. 8 is a diagram schematically showing an example of a photodetector adopted in the optical pickup according to the present invention.

There may be as many photodetectors 100 of FIG. 3 as there are lights emitted from the light source 30 to receive the light reflected from the recording medium 1. That is, as shown in FIG. 4, when three VCSELs 30a, 30b and 30c are adopted as the light source 30, the optical pickup of the present invention includes first, second and third photodetectors 100a, 100b and 100c as shown in FIG. 8. Here, at least one of the first, second and third photodetectors 100a, 100b and 100c includes at least two divided plates for separately performing photoelectric conversion to detect a tracking error signal and a focus error signal of the recording medium 1. Preferably, as shown in FIG. 8, the second photodetector 100b includes four rectangular divided plates $A_1$, $B_1$, $C_1$ and $D_1$, and four L-shaped divided plates $A_2$, $B_2$, $C_2$ and $D_2$.

Here, the rectangular divided plates $A_1$, $B_1$, $C_1$ and $D_1$ are used for detecting an error signal of a relatively thin disk, e.g., the DVD, and all divided plates $(A_1+A_2)$, $(B_1+B_2)$, $(C_1+C_2)$ and $(D_1+D_2)$ are used for detecting an error signal of a relatively thick disk, e.g., the CD.

Also, it is preferable that the optical pickup of the present invention further includes a collimating lens 50 which is positioned on the optical path between the light source 30 (see FIG. 3) and the light controller 70, for collimating a divergent light being incident from the light source 30.

Further, preferably, the optical pickup of the present invention includes a sensing lens 90 positioned on the light path between the polarization beam splitter 40 and the photodetector 100 to detect a focusing error signal by an astigmatism method.

Hereinafter, the operation of the optical pickup according to the preferred embodiment of the present invention will be described.

Figure 9:
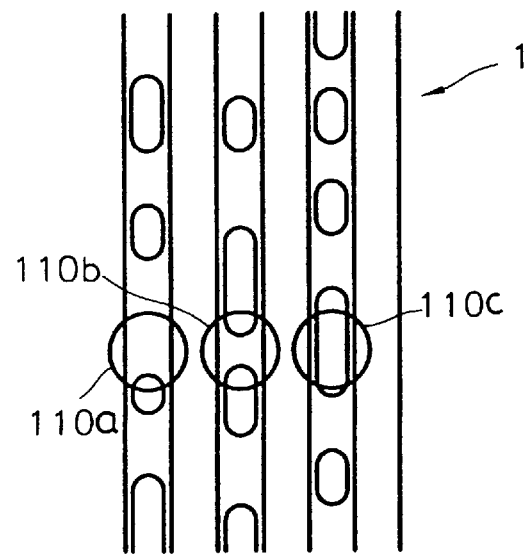
FIG. 9 is a diagram schematically showing a state in which the light emitted from a light source is focused on tracks of a recording medium in the optical pickup according to the present invention.

Referring to FIG. 3, three beams emitted from the first, second and third VCSELs 30a, 30b and 30c form light spots on the recording medium 1 via the polarization beam splitter 40, the collimating lens 50, the λ/4 retardation plate 60, the light controller 70 and the objective lens 80 in sequence. Here, as shown in FIG. 9, the light spots formed on the recording medium 1 are focused on different tracks. FIG. 9 shows an example when a CD is adopted as the recording medium 1. Here, beams emitted from the first, second and third VCSELs 30a, 30b and 30c (see FIG. 3) are focused on first, second and third track positions 110a, 110b and 110c of the recording medium 1, respectively. The light beams reflected from each track are received by the first, second and third photodetectors 100a, 100b and 100c (see FIG. 8) via the objective lens 80, the light controller 70, the λ/4 retardation plate 60, the polarization beam splitter 40 and the sensing lens 90. The light beams received by the first, second and third photodetectors 100a, 100b and 100c are converted into an electrical signal such that information recorded in each track is detected from the electrical signal, and at the same time a focusing error signal and a tracking error signal of the objective lens 80 are detected by the photodetector 100b. Here, the focus error signal is detected by the widely known astigmatism method, and the tracking error signal is detected by a differential phase detection (DPD) method.

According to the present invention, information recorded in three tracks can be detected at the same time when the CD rotates so that the information processing speed can be increased without increasing the rotation speed of a spindle motor for rotating the disk.

On the other hand, as described above, when reproducing information recorded on a DVD using an optical pickup in which the light source 30 is arranged to form light spots on three adjacent tracks of the CD, it is difficult to form light spots on three tracks of the DVD due to the difference of distance between tracks of the CD and the DVD. Thus, in this case, information recorded in only one track is reproduced using one light source.

As described above, in the optical pickup of the present invention, information recorded in a plurality of tracks of a disk can be detected simultaneously by adopting a plurality of VCSELs and photodetectors, so that the information processing speed can be increased without increasing the rotation speed of the disk. Also, the light controller is positioned on the optical path so that disks having different formats can be adopted.

The present invention has been illustrated and described with reference to a specific embodiment, however, the present invention is not limited to the particular form illustrated, and further modifications and alterations will occur to those skilled in the art within the spirit and scope of the present invention, as defined by the appended claims.

What is claimed is:

1. An optical pickup comprising:
   a light source including at least two vertical cavity surface emitting lasers (VCSELs) arranged adjacent to each other to emit light parallel to the stacking direction of the semiconductor material layers of the VCSEL:
   an objective lens which converges at least two lights emitted from said light source on a recording medium;
   a polarization beam splitter positioned on a light path between said light source and said objective lens, which changes a traveling direction of an incident light;
   a light controller positioned on the light path between said light source and the recording medium, for controlling a focal position of said at least two lights converged by said objective lens; and
   at least two photodetectors each receiving light reflected from the recording medium via said objective lens and said polarization beam splitter,
   wherein said light controller comprises a light controlling portion formed on a surface of said objective lens to block or scatter at least part of the light passing through an intermediate domain of said objective lens.

2. The optical pickup of claim 1, wherein each of said at least two VCSELs comprises:
   a substrate;
   a lower distributed Bragg reflecting (DBR) layer, an active layer and an upper DBR layer which are stacked on said substrate in sequence;
   a lower electrode layer formed below said substrate; and
   an upper electrode layer formed on said upper DBR layer, having a window via which light is emitted.

3. The optical pickup of claim 1, further comprising:
   a λ/4 retardation plate for changing an incident linear polarized light into a circular polarized light, and an incident circular polarized light into a linear polarized light.

4. The optical pickup of claim 1, wherein a number of said photodetectors equals that of said VCSELs, and at least one of said photodetectors includes at least two divided plates for separately performing photoelectric conversion to detect a track error signal and a focus error signal of the recording medium.

5. The optical pickup of claim 1, further comprising a sensing lens disposed between said at least two photodetectors and said polarization beam splitter, and a collimating lens disposed between said light controller and said polarization beam splitter.

6. The optical pickup of claim 1, wherein said light controlling portion includes a light controlling layer formed on the surface of said objective lens through a reflective coating.

7. The optical pickup of claim 1, wherein said light controlling portion includes an annular groove formed on the surface of said objective lens.

8. An optical pickup comprising:
   a light source including at least two vertical cavity surface emitting lasers (VCSELs) arranged adjacent to each other to emit light parallel to the stacking direction of the semiconductor material layers of the VCSEL:
   an objective lens which converges at least two lights emitted from said light source on a recording medium;
   a polarization beam splitter positioned on a light path between said light source and said objective lens, which changes a traveling direction of an incident light;
   a light controller positioned on the light path between said light source and the recording medium, for controlling a focal position of said at least two lights converged by said objective lens; and
   at least two photodetectors each receiving light reflected from the recording medium via said objective lens and said polarization beam splitter,
   wherein said light controller is a transparent member having a light blocking portion which is arranged on a light path being separated from the objective lens to block at least part of the light passing through an intermediate domain of said objective lens.

* * * * *